(12) United States Patent
Wang

(10) Patent No.: US 7,591,067 B2
(45) Date of Patent: Sep. 22, 2009

(54) THERMALLY ENHANCED CORELESS THIN SUBSTRATE WITH EMBEDDED CHIP AND METHOD FOR MANUFACTURING THE SAME

(75) Inventor: Chien-Hao Wang, Hsinchu County (TW)

(73) Assignee: Advanced Semiconductor Engineering Inc., Kaohsiung (TW)

( * ) Notice: Subject to any disclaimer, the term of this patent is extended or adjusted under 35 U.S.C. 154(b) by 462 days.

(21) Appl. No.: 11/616,288

(22) Filed: Dec. 27, 2006

(65) Prior Publication Data
US 2007/0155057 A1    Jul. 5, 2007

(30) Foreign Application Priority Data
Dec. 30, 2005    (TW) .............................. 94147759 A

(51) Int. Cl.
*H05K 1/18*    (2006.01)
(52) U.S. Cl. .............................. 29/832; 29/830; 29/852; 29/854; 29/846; 439/71; 361/729; 361/705; 361/783; 437/209; 437/211
(58) Field of Classification Search ................ 29/832, 29/830, 852, 854, 846; 437/209, 211; 361/729, 361/705, 783; 439/71
See application file for complete search history.

(56) References Cited

U.S. PATENT DOCUMENTS

| | | | | |
|---|---|---|---|---|
| 5,745,984 A | * | 5/1998 | Cole et al. | 29/834 |
| 6,555,906 B2 | * | 4/2003 | Towle et al. | 257/723 |
| 6,972,964 B2 | * | 12/2005 | Ho et al. | 361/761 |

* cited by examiner

*Primary Examiner*—Derris H Banks
*Assistant Examiner*—Dan D Le
(74) *Attorney, Agent, or Firm*—Jianq Chyun IP Office

(57) ABSTRACT

A thermally enhanced coreless thin substrate with embedded chips, which mainly includes a patterned carrier metal layer, at least one chip, at least one dielectric layer and at least one wiring layer, is disclosed. The chip is attached to a heat sink portion of the patterned carrier metal layer. The dielectric layer is formed over the patterned carrier metal layer and covers the chip. The wiring layer is formed on the dielectric layer for electrically connecting the patterned carrier metal layer and the chip. In the process of manufacturing the thermally enhanced coreless thin substrate with embedded chips, the heat sink portion is formed by patterning the patterned carrier metal layer after finishing the formation of the wiring layer. Thus, a thin board type electronic device that combines a heat sink, a carrier substrate and embedded chips together to form an integral unit is fabricated.

11 Claims, 7 Drawing Sheets

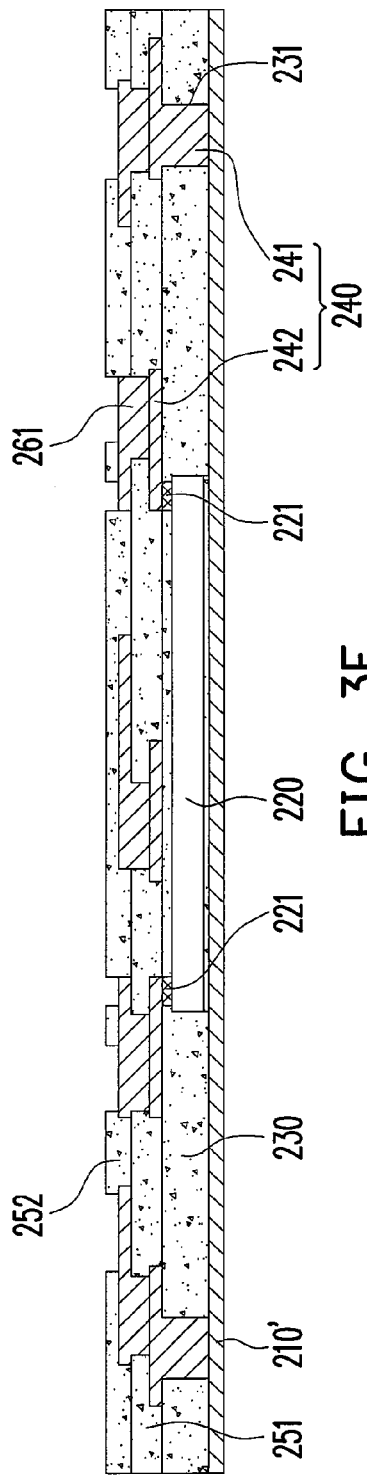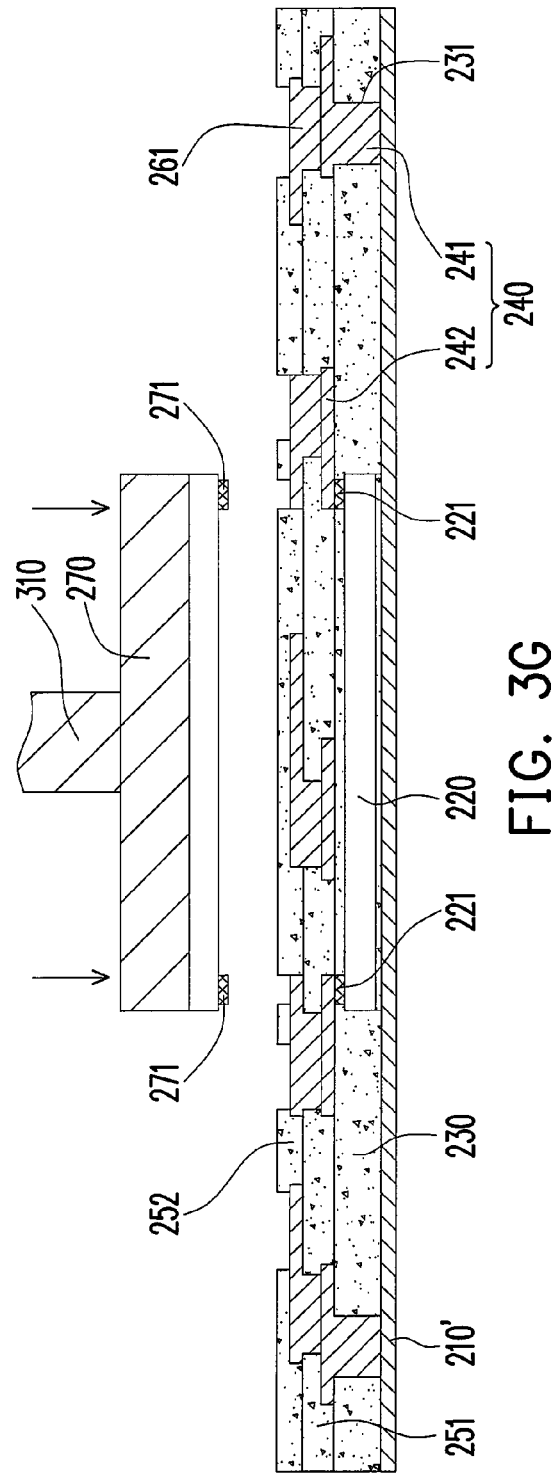
FIG. 3F
FIG. 3G

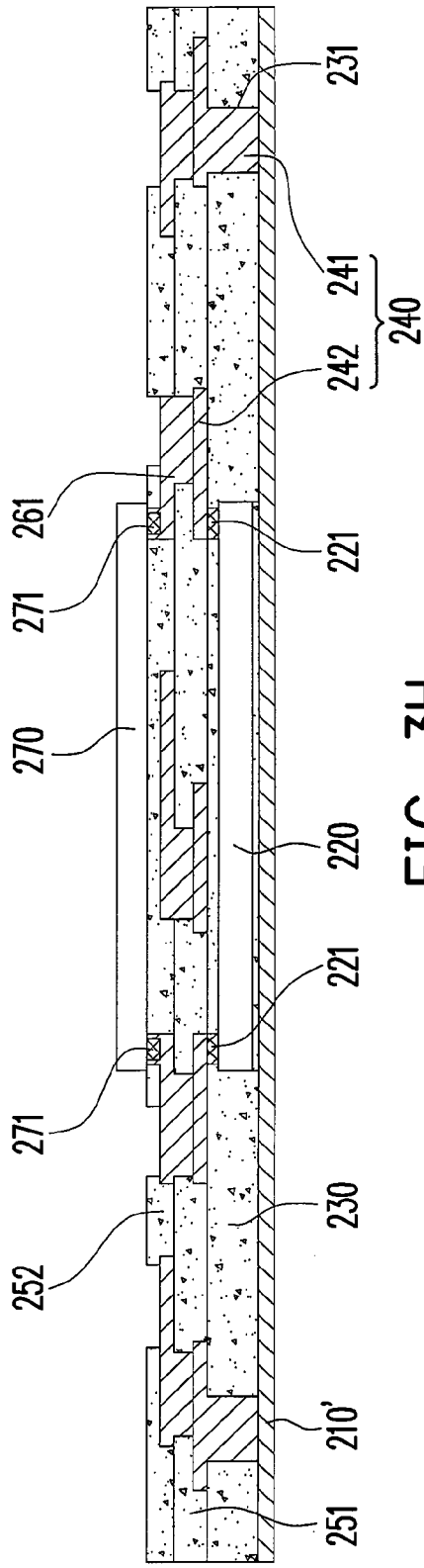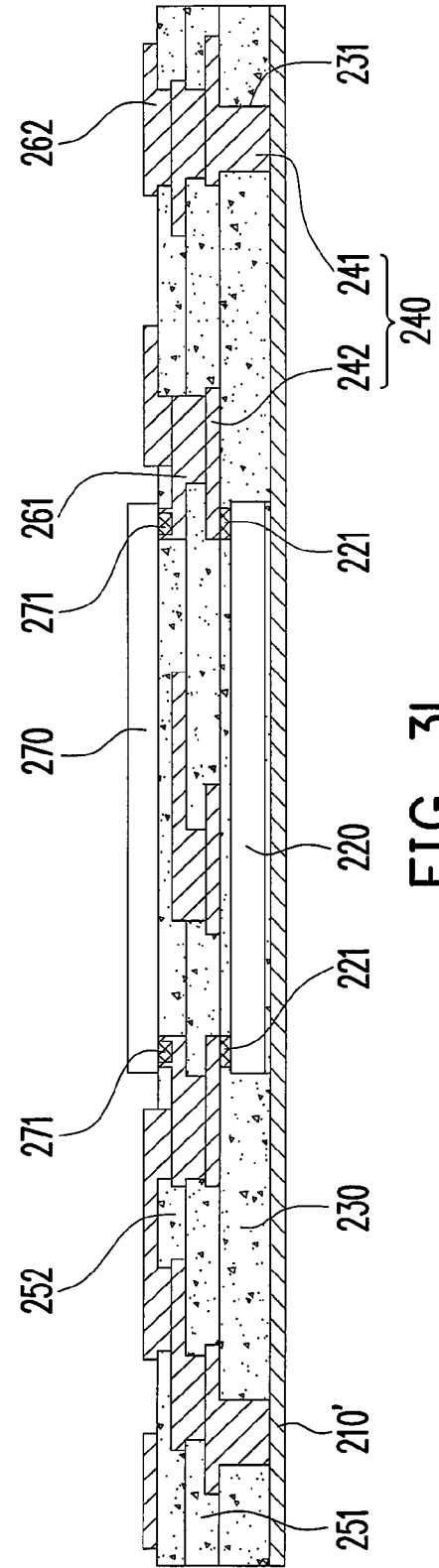
FIG. 3H
FIG. 3I

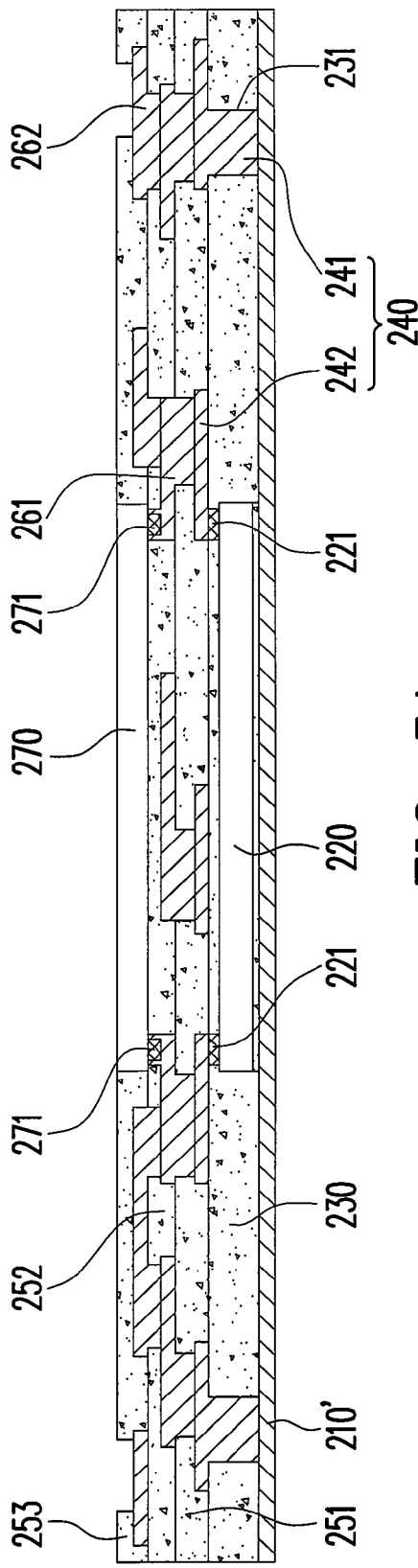
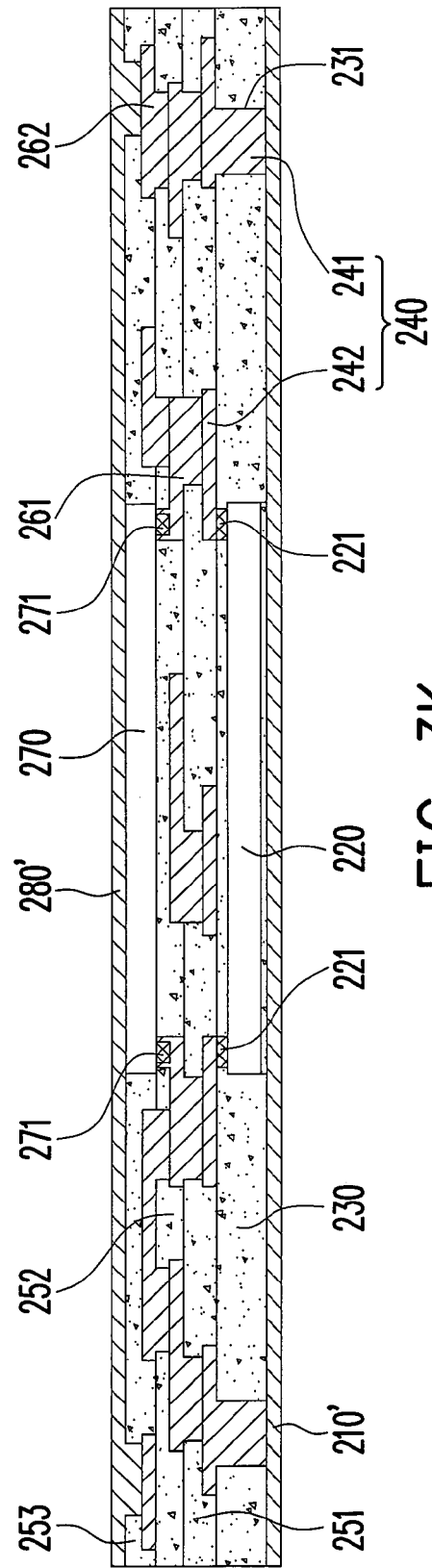
FIG. 3J
FIG. 3K

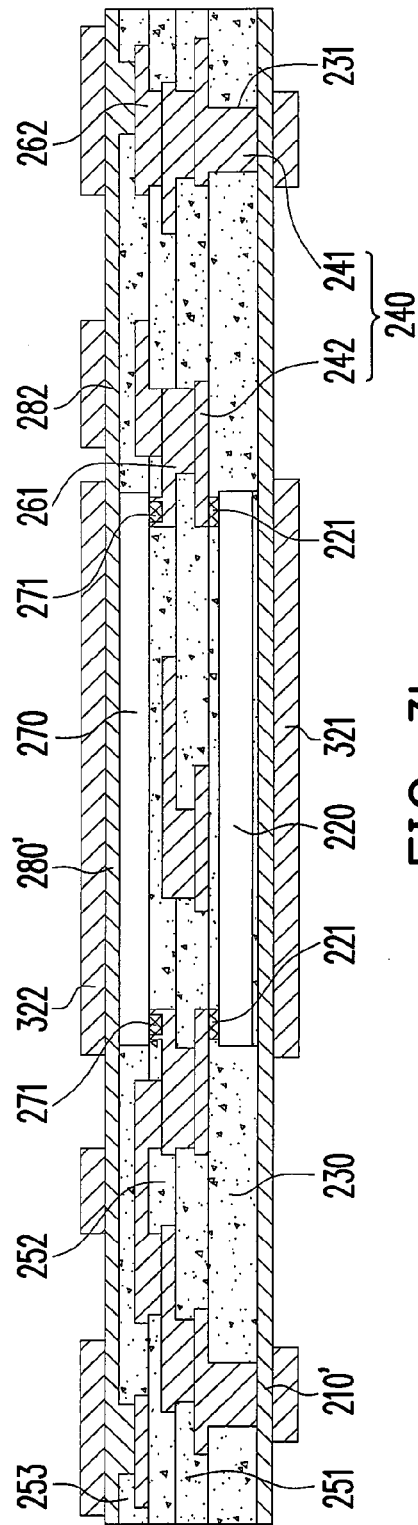
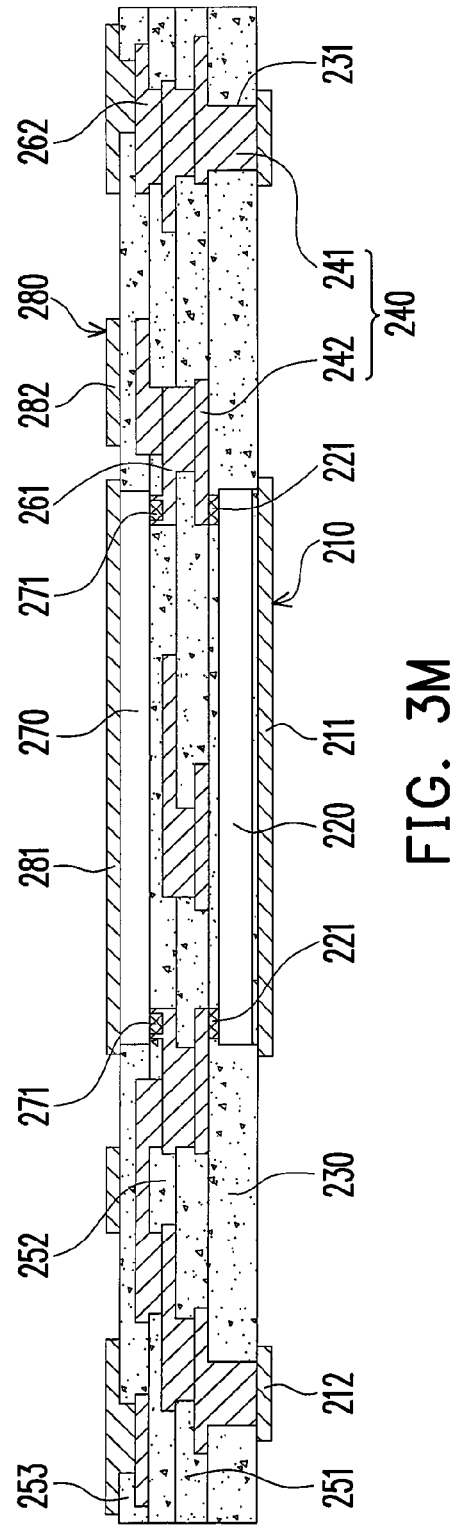
FIG. 3L
FIG. 3M

THERMALLY ENHANCED CORELESS THIN SUBSTRATE WITH EMBEDDED CHIP AND METHOD FOR MANUFACTURING THE SAME

CROSS-REFERENCE TO RELATED APPLICATION

This application claims the priority benefit of Taiwan application serial no. 94147759, filed Dec. 30, 2005. All disclosure of the Taiwan application is incorporated herein by reference.

BACKGROUND OF THE INVENTION

1. Field of the Invention

The present invention relates to a circuit board with an embedded chip, and more particularly, to a thermally enhanced coreless thin substrate with an embedded chip and method for manufacturing the same.

2. Description of Related Art

Conventionally, the circuit board, the chip package and the combination of modularized chip package components are separately manufactured and applied. In general, the electronic device so fabricated, for example, a multi-chip package module has a thicker structure and a longer route for electrical transmission. FIG. 1 is a schematic cross-sectional view of a conventional multi-chip package module. The conventional multi-chip package module 100 in FIG. 1 mainly comprises a circuit substrate 110, a plurality of chips 120 and a heat sink 130. The chips 120 can be flip chips with a plurality of bumps 121 or chip package components. The substrate 110 has a plurality of inner connecting pads 113 disposed on a top surface 111 and a plurality of outer connecting pads 114 disposed on a bottom surface 112. The chips 120 are disposed on the top surface 111 of the substrate 110 and are electrically connected to the inner connecting pads 113 through the bumps 121. The heat sink 130 is attached on the chips 120. In general, a plurality of solder balls 140 are bonded to the outer connecting pads 114. Because the substrate 110 is a printed circuit board fabricated in a laminate or build-up technique, the packaging and modular combination of these chips 120 are applied independently. Therefore, the multi-chip package module 100 is thicker than usual and the average electrical transmission paths are longer, and signal transmission is more vulnerably interfered through cross-talk effect.

SUMMARY OF THE INVENTION

Accordingly, at least one objective of the present invention is to provide a thermally enhanced coreless thin substrate with an embedded chip. A patterned carrier metal layer inside a substrate includes at least one heat sink portion and at least one chip is disposed on the heat sink portion. A dielectric layer inside the substrate covers the chip. A wiring layer inside the substrate is formed on the dielectric layer. The wiring layer electrically connects the chip to the patterned carrier metal layer. The present invention joins a substrate, a chip and a heat sink of a conventional multi-chip package module together to form an integral thin board type electronic device. As a result, the thickness of the device is pared down and yet the structure is able to provide the embedded chip with an enhanced capacity to dissipate heat and tighter seal. Hence, its assembling ability, interconnection reliability and electrical performance are improved and its subsequent packaging density and resistance to cross-talk effect are enhanced.

Another objective of the present invention is to provide a method for manufacturing a thermally enhanced coreless thin substrate with an embedded chip. The patterning of the patterned carrier metal layer in the substrate is performed after the formation of the wiring layer inside the substrate so that the patterned carrier metal layer functions as a carrier for the chip, a heat sink for the chip and an electrical connection with the chip.

According to the present invention, a thermally enhanced coreless thin substrate with an embedded chip mainly comprises a patterned carrier metal layer, at least one chip, a dielectric layer and a wiring layer. The patterned carrier metal layer at least comprises a heat sink portion. The chip is disposed on the heat sink portion. Furthermore, the chip has a plurality of electrodes. The dielectric layer is formed on the patterned carrier metal layer and covers the chip. In addition, the dielectric layer has a plurality of through holes. These through holes are linked to the patterned carrier metal layer, and the dielectric layer exposes the electrodes on the chip. The wiring layer is formed on the dielectric layer. The wiring layer includes a plurality of first trace lines and a plurality of second trace lines. The first trace lines are electrically connected to the patterned carrier metal layer via the through holes and the second trace lines are electrically connected to the electrodes.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIGS. 3A through 3M are schematic cross-sectional views showing the process of fabricating a thermally enhanced coreless thin substrate with embedded chips according to one embodiment of the present invention.

DESCRIPTION OF THE PREFERRED EMBODIMENTS

Figure 1:
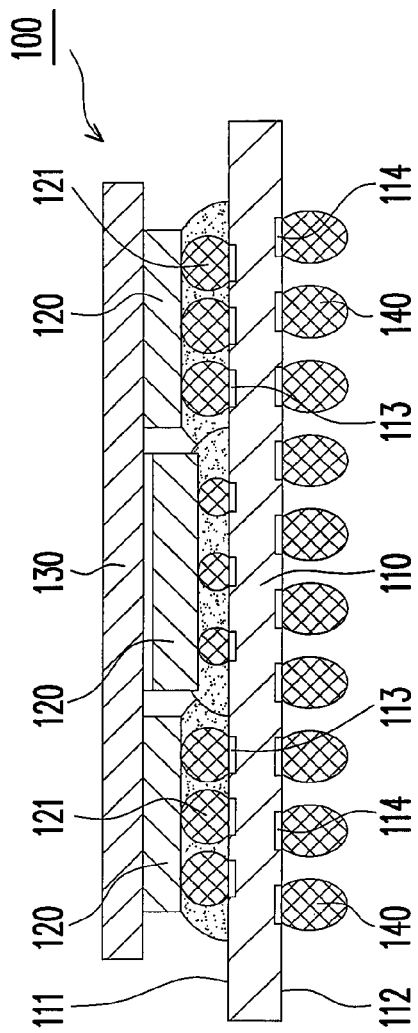
FIG. 1 is a schematic cross-sectional view of a conventional multi-chip package module.

Reference will now be made in detail to the present preferred embodiments of the invention, examples of which are illustrated in the accompanying drawings. Wherever possible, the same reference numbers are used in the drawings and the description to refer to the same or like parts.

Figure 2:
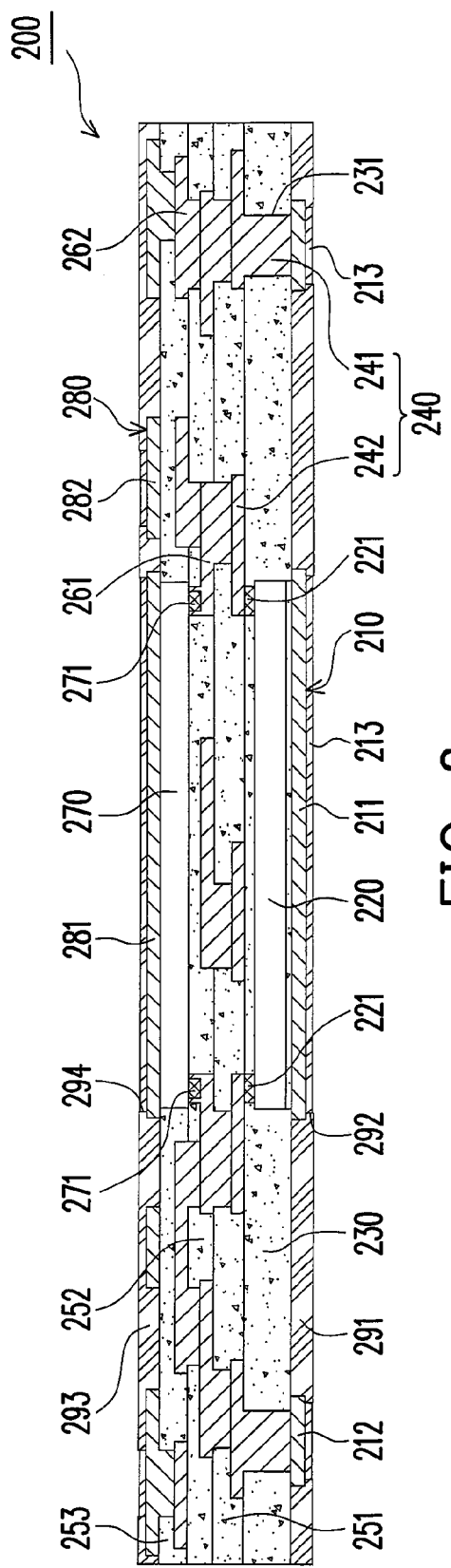
FIG. 2 is a schematic cross-sectional view of a thermally enhanced coreless thin substrate with embedded chips according to one embodiment of the present invention.

FIG. 2 is a schematic cross-sectional view of a thermally enhanced coreless thin substrate with embedded chips according to one embodiment of the present invention. The thermally enhanced coreless thin substrate 200 with an embedded chip mainly comprises a patterned carrier metal layer 210, at least one first chip 220, a first dielectric layer 230 and a first wiring layer 240. The patterned carrier metal layer 210 at least comprises a heat sink portion 211. The patterned carrier metal layer 210 can be fabricated by patterning a copper foil or other conductive films. In the present embodiment, the patterned carrier metal layer 210 further comprises a plurality of connecting pads 212 for electrically connecting to external devices. Preferably, the patterned carrier metal layer 210 is a wiring layer having a wiring structure capable of minimizing the number of wiring layers inside the substrate.

The first chip 220 is disposed on the heat sink portion 211 by adhesion or eutectic bonding. Furthermore, the first chip 220 has a plurality of electrodes 221 and the electrodes 221 can be bonding pads or bumps. The first chip 220 further includes an integrated circuit component (not drawn).

The first dielectric layer 230 is formed on the patterned carrier metal layer 210 and covers the first chip 220. The first dielectric layer 230 is fabricated using an electrically insulating material such as polyimide (PI) or polyethylene terephthalate (PET). The first dielectric layer 230 has a plurality of through holes 231 and the through holes 231 are linked to the patterned carrier metal layer 210. Furthermore, the first dielectric layer 230 also exposes the electrodes 221. The first wiring layer 240 is formed on the first dielectric layer 230. The first wiring layer 240 comprises a plurality of first trace lines 241 and a plurality of second trace lines 242. The first trace lines 241 are electrically connected to the connecting pads 212 of the patterned carrier metal layer 210 via the through holes 231. The second trace lines 242 are electrically connected to the electrodes 221. The first trace lines 241 may electrically connect to the corresponding second trace lines 242 either directly or through other wiring layers.

In the process of fabricating the thermally enhanced coreless thin substrate 200 with an embedded chip, the heat sink portion 211 of the patterned carrier metal layer 210 is used for supporting the first chip 220. By forming the first dielectric layer 230 over the patterned carrier metal layer 210 and covering the first chip 220, the first chip 220 is embedded within the patterned carrier metal layer 210 and the first dielectric layer 230 to enhance its heat dissipating capacity and reduce its package thickness. Therefore, the patterned carrier metal layer 210 can save a conventional chip carrier, a heat sink and at least one wiring layer inside the carrier substrate because it is a single component with all the foregoing functions. Furthermore, at least one chip is embedded in the interior of the thermally enhanced coreless thin substrate 200.

In the present embodiment, the thermally enhanced coreless thin substrate 200 with an embedded chip further comprises a first solder mask layer 291 formed underneath the patterned carrier metal layer 210. The first solder mask layer 291 exposes the connecting pads 212 on the patterned carrier metal layer 210. Furthermore, the first solder mask layer 291 has an opening 292 that exposes the heat sink portion 211 so that the heat sink portion 211 has an exposed surface for providing the thermally enhanced coreless thin substrate 200 with good heat dissipation. Preferably, the exposed surfaces of the connecting pads 212 have a plated layer 213, for example, a nickel-gold plated layer to prevent the oxidation of the connecting pads 212. Moreover, the plated layer 213 may also be formed on the exposed surface of the heat sink portion 211. In the present embodiment, an additional second dielectric layer 251 may also be formed on the first wiring layer 240. A second wiring layer 261 is formed on the second dielectric layer 251 and the second wiring layer 261 is electrically connected to the first wiring layer 240. Because the second dielectric layer 251 is used for isolating the first wiring layer 240 from the second wiring layer 261, the thickness of the second dielectric layer 251 can be smaller than the first dielectric layer 230. Moreover, the number of wiring layers and dielectric layers can be gradually increased until the desired wiring structure is obtained. In the present embodiment, the thermally enhanced coreless thin substrate 200 with an embedded chip may be used to replace a conventional multi-chip module. A third dielectric layer 252 is formed on the second wiring layer 261 and a third wiring layer 262 is formed on the third dielectric layer 252. The second wiring layer 261 and the third wiring layer 262 are used to electrically connect with the first trace lines 241 and the second trace lines 242 of the first wiring layer 240. Furthermore, a fourth dielectric layer 253 covers the third wiring layer 262. At least one second chip 270 can be disposed on the second wiring layer 261. A plurality of electrodes 271 of the second chip 270 is electrically connected to the second wiring layer 261. Preferably, the substrate 200 further comprises a patterned covering metal layer 280 formed on the second chip 270 and the fourth dielectric layer 253. The patterned covering metal layer 280 at least comprises a heat sink portion 281 attached to the second chip 270. In addition, a second solder mask layer 293 is formed on the uppermost layer of the substrate 200 to cover the circuit section of the patterned covering metal layer 280. The second solder mask layer 293 has an opening 294 that exposes the heat sink portion 281 of the patterned covering metal layer 280. If the patterned covering metal layer 280 has a plurality of connecting pads 282, the second solder mask layer 293 also exposes the connecting pads 282. Preferably, a plated layer 213 is formed on the exposed surfaces of the heat sink portion 281 and the connecting pads 282 to prevent oxidation. Thus, the thermally enhanced coreless thin substrate 200 with embedded chips not only has superior assembling ability and interconnection reliability, but also has a higher wiring density and thinner package dimension. Moreover, the substrate 200 has a better electrical performance. Not only are the interconnections between the chips 220 and 270 within the substrate 200 enhanced, cross-talk effect between transmission wires is also minimized as well.

Figure 3A:
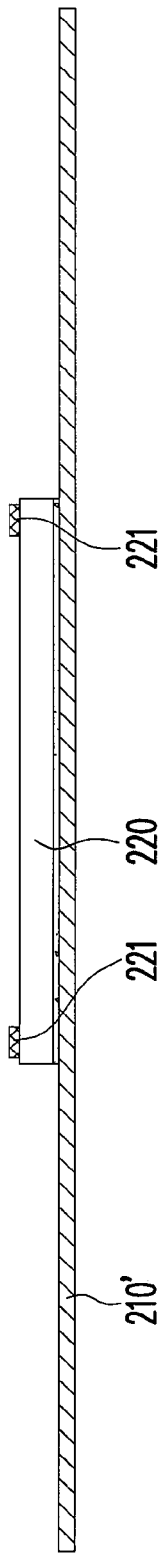
Figure 3B:
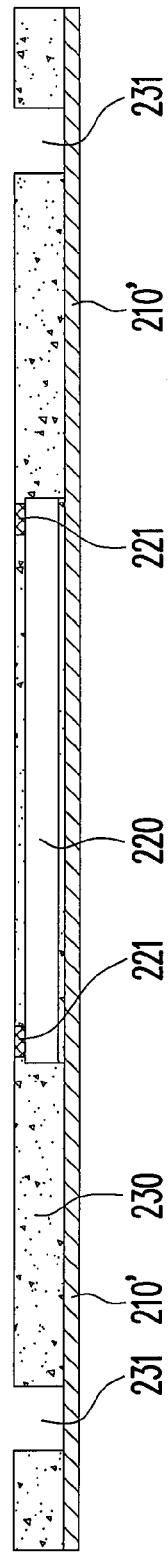
Figure 3C:
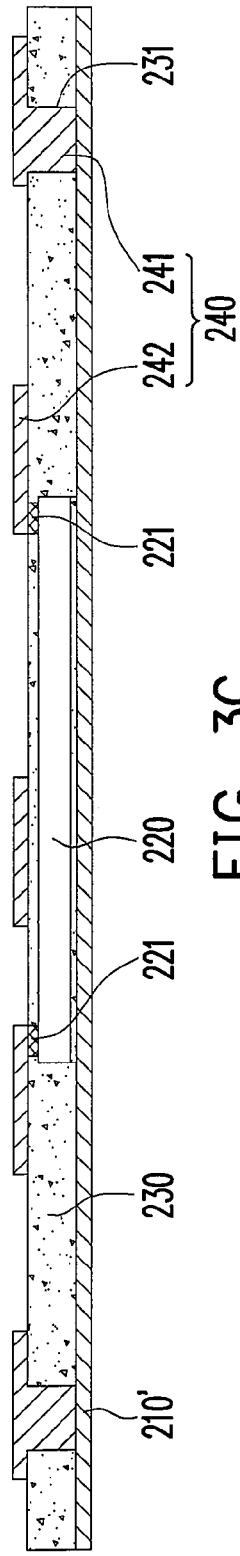
Figure 3D:
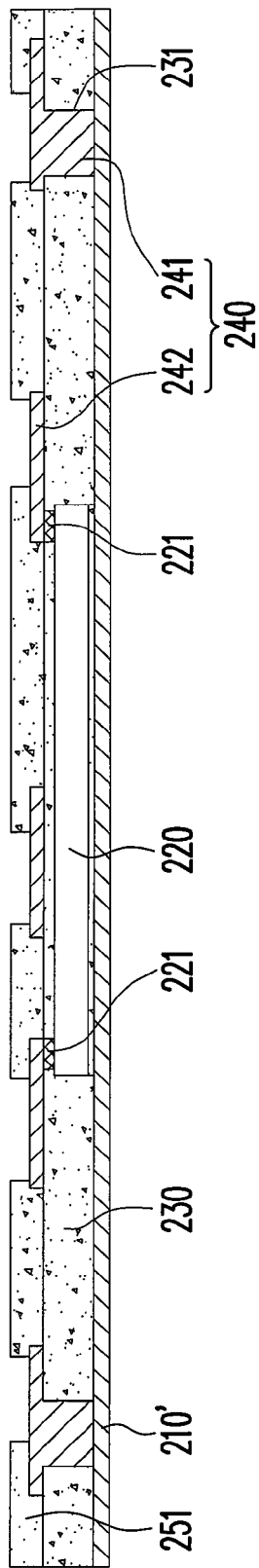
Figure 3E:
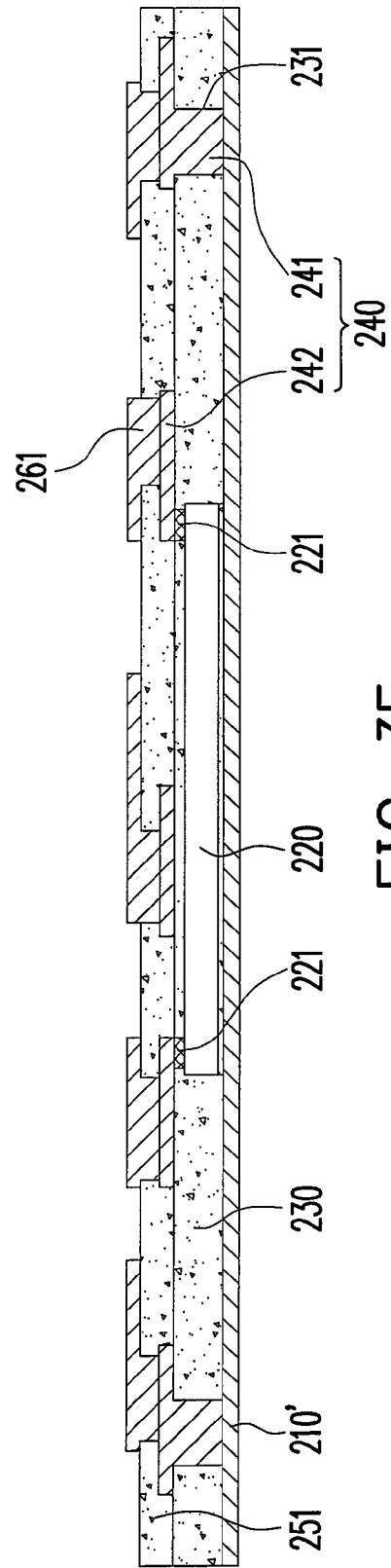

The method of manufacturing the thermally enhanced coreless thin substrate 200 is shown with reference to a series of cross-sectional diagrams from FIGS. 3A through 3M. First, as shown in FIG. 3A, a carrier metal layer 210' is provided. The carrier metal layer 210' can be a copper foil. At least one of the first chip 220 is attached to the carrier metal layer 210' through adhesion or eutectic bonding method. Moreover, the electrodes 221 of the first chip 220 face upward and are exposed. Then, as shown in FIG. 3B, the first dielectric layer 230 is formed on the carrier metal layer 210' by a digital inkjet printing or a stencil printing method, and the first dielectric layer 230 covers the first chip 220 but exposes the electrodes 221. Preferably, the digital inkjet printing method is used because the first dielectric layer 230 can be shaped into various kinds of patterns and its thickness in different areas can be carefully controlled. For example, the first dielectric layer 230 is thinner over the first chip 220 and thicker over the carrier metal layer 210'. The through holes 231 may be formed in-situ with the formation of the first dielectric layer 230 or afterwards through performing an exposure and development process. The through holes 231 are linked to the carrier metal layer 210'. Thereafter, as shown in FIG. 3C, the first wiring layer 240 is formed on the first dielectric layer 230 by etching the copper foil or performing photoresist interior plating. The first trace lines 241 of the first wiring layer 240 are electrically connected to the carrier metal layer 210' via the through holes 231. The second trace lines 242 of the first wiring layer 240 are electrically connected to the electrodes 221. Next, as shown in FIG. 3D, the second dielectric layer 251 is formed on the first wiring layer 240. In the present embodiment, the second dielectric layer 251 has suitable through-hole structures for exposing the first trace lines 241 and the second trace lines 242 of the first wiring layer 240. Then, as shown in FIG. 3E, the second wiring layer 261 is formed on the second dielectric layer 251. The second wiring layer 261 is electrically connected to the first wiring layer 240. After that, as shown in FIG. 3F, the third dielectric layer 252 is formed on the second wiring layer 261. The third dielectric layer 252 has suitable through-hole structures for exposing parts of the second wiring layer 261. Subsequently, as shown in FIG. 3G, a thermal compression fixture 310 is used to dispose the second chip 270 on the third dielectric layer 252. As shown in FIG. 3H, the electrodes 271 of the second chip 270 are electrically connected to the second wiring layer 261. Afterwards, as shown in FIG. 3I, the third wiring layer 262 is formed on the third dielectric layer 252. Next, as shown in FIG. 3J, the fourth dielectric layer 253 is formed on the third wiring layer 262. Similarly, the digital inkjet printing technique can be used so that the outer surface of the fourth dielectric layer 253 is almost flushed with the second chip 270 and prevented from covering the second chip 270. Then, as shown in FIG. 3K, a covering metal layer 280' is formed on the second chip 270 and the fourth dielectric layer 253. Next, as shown in FIG. 3L, an exposure and development process is used to form a mask 321 on the carrier metal layer 210' and a mask 322 on the covering metal layer 280' for etching the carrier metal layer 210' and the covering metal layer 280'. For example, a dry film or a photoresist layer may serve as the masks 321 and 322. Afterwards, as shown in FIG. 3M, the carrier metal layer 210' is patterned to form the patterned carrier metal layer 210 that comprises the heat sink portion 211 and the connecting pads 212. Meanwhile, the covering metal layer 280' is patterned to form the patterned covering metal layer 280 that comprises the heat sink portion 281 and the connecting pads 282. Finally, as shown in FIG. 2, the first solder mask layer 291 is formed on the patterned carrier metal layer 210 and the second solder mask layer 293 is formed on the patterned covering metal layer 280 to produce the thermally enhanced coreless thin substrate 200 with embedded chips. Therefore, the carrier metal layer 210' functions as a chip carrier, a heat sink and an electrical connection for the chip in the manufacturing process.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for manufacturing a thermally enhanced coreless thin substrate with an embedded chip, comprising:
   providing a carrier metal layer;
   attaching at least one chip to the carrier metal layer, wherein the chip has a plurality of electrodes;
   forming a first dielectric layer on the carrier metal layer and covering the chip, wherein the first dielectric layer has a plurality of through holes, the through holes are linked to the carrier metal layer, and the first dielectric layer exposes the electrodes;
   forming a first wiring layer on the first dielectric layer, wherein the first wiring layer comprises a plurality of first trace lines and a plurality of second trace lines, the first trace lines is electrically connected to the carrier metal layer via the through holes and the second trace lines are electrically connected to the electrodes; and
   patterning the carrier metal layer so that the carrier metal layer comprises a heat sink portion attached to the chip.

2. The method of claim 1, further comprising forming a first solder mask layer underneath the patterned carrier metal layer, wherein the first solder mask layer has an opening for exposing the heat sink portion so that the heat sink portion has an exposed surface.

3. The method of claim 2, wherein the patterned carrier metal layer further comprises a plurality of connecting pads electrically connected to the first trace lines.

4. The method of claim 3, further comprising forming a plated layer on the connecting pads and the exposed surface of the heat sink portion.

5. The method of claim 1, wherein the first trace lines are electrically connected to the corresponding second trace lines.

6. The method of claim 1, further comprising:
   forming a second dielectric layer on the first wiring layer; and
   forming a second wiring layer on the second dielectric layer.

7. The method of claim 6, further comprising:
   disposing a second chip on the second wiring layer.

8. The method of claim 7, further comprising:
   forming a patterned covering metal layer on the second chip, wherein the patterned covering metal layer at least comprises a heat sink portion attached to the second chip.

9. The method of claim 8, further comprising:
   forming a second solder mask layer on the patterned covering metal layer.

10. The method of claim 1, wherein the first dielectric layer is formed in a digital inkjet printing process.

11. The method of claim 1, wherein the patterned carrier metal layer is also a wiring layer.

* * * * *